(12) United States Patent
Hsu et al.

(10) Patent No.: US 10,102,921 B1
(45) Date of Patent: Oct. 16, 2018

(54) FUSE BLOWING METHOD AND FUSE BLOWING SYSTEM

(71) Applicant: NANYA TECHNOLOGY CORPORATION, New Taipei (TW)

(72) Inventors: Ting-Shuo Hsu, New Taipei (TW); Chih-Wei Shen, Yunlin County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/680,182

(22) Filed: Aug. 17, 2017

(51) Int. Cl.
    *G11C 7/00* (2006.01)
    *G11C 29/00* (2006.01)
    *G11C 11/408* (2006.01)

(52) U.S. Cl.
    CPC ........ *G11C 29/787* (2013.01); *G11C 11/4087* (2013.01)

(58) Field of Classification Search
    CPC . G11C 11/406; G11C 11/40615; G11C 14/00; G11C 2207/2227; G11C 2211/4067; G11C 5/14; G11C 5/145; G11C 5/147; G11C 29/785; G11C 2207/002; G11C 2207/005; G11C 29/72; G11C 7/06; G11C 7/18; G11C 29/50
    USPC ....... 365/227, 222, 226, 201, 228, 229, 149, 365/189.09, 203, 233.1, 185.17, 200, 365/230.06, 185.05, 185.18, 185.33, 365/189.011, 189.07, 189.11
    See application file for complete search history.

(56) References Cited

U.S. PATENT DOCUMENTS

2003/0117872 A1 * 6/2003 Akamatsu .............. G11C 29/24 365/201

* cited by examiner

*Primary Examiner* — Thong Q Le
(74) *Attorney, Agent, or Firm* — CKC & Partners Co., Ltd.

(57) ABSTRACT

A fuse blowing method is disclosed. The fuse blowing method comprises the following operations: detecting a plurality of voltages of a plurality of word lines; sending an enabling signal to a fuse circuit when one of the voltages is below a voltage threshold, in which the one of the voltages corresponds to one of the word lines; and blowing a fuse, in which the fuse is connected to the one of the word lines, such that the one of the voltages is higher than the voltage threshold.

13 Claims, 2 Drawing Sheets

FUSE BLOWING METHOD AND FUSE BLOWING SYSTEM

FIELD OF INVENTION

The invention relates to a fuse blowing method and a fuse blowing system. More particularly, the invention relates to a fuse blowing method and a fuse blowing system for auto repairing.

BACKGROUND

An integrated circuit may include redundant components that can be used to substitute damaged componentry. For example, one type of memory circuit includes a dynamic random access memory (DRAM) array of memory cells. The memory cells are arranged in rows and columns, each of which is addressable for purposes of storing a bit of information. As the density of memory cells increase, the number of faulty cells also increases during the fabrication process. To reduce the effect of faulty cells, redundant memory cells, or rather redundant sections of memory cells may be used to repair a damaged section of the array, wherein the damaged section includes one or more damaged memory cells.

Once a damaged section of the integrated circuit is identified, the repair process includes replacing the damaged section with a redundant resource. For instance, in the memory array, selection of the redundant section may be achieved through the application of fuse circuitry. More specifically, a fuse that is associated with a redundant section may be blown, such that when the fuse is intact, the original but later damaged section of memory is accessed for memory storage, but when the fuse is blown, the redundant section is then used for memory storage instead of the damaged section. Various techniques may be used to blow the fuse. However, normally it takes time when the operations of finding the damaged section and starting the repair process are performed by human.

Therefore, how to auto repair the memory are problems to be improved in the field.

SUMMARY

An embodiment of this disclosure is to provide a fuse blowing method. The fuse blowing method comprises the following operations: detecting a plurality of voltages of a plurality of word lines; sending an enabling signal to a fuse circuit when one of the voltages is below a voltage threshold, in which the one of the voltages corresponds to one of the word lines; and blowing a fuse, in which the fuse is connected to the one of the word lines, such that the one of the voltages is higher than the voltage threshold.

An embodiment of this disclosure is to provide a fuse blowing system. The fuse blowing system comprises a memory, a voltage detector, and a fuse circuit. The memory comprises a plurality of word lines and a plurality of memory cells. Each of the memory cells is electrically connected to one of the word lines. The voltage detector is configured to detect a plurality of voltages of the word lines. The fuse circuit is configured to blow one of the fuse when one of the voltages detected is below a voltage threshold such that the one of the voltages is higher than the voltage threshold, wherein the one of the fuse is connected between one of the memory cells and one of the word lines, wherein the one of the word lines corresponds to the one of the voltages.

The embodiment of the present disclosure is to provide a fuse blowing method and a fuse blowing system, in order to auto repair a memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
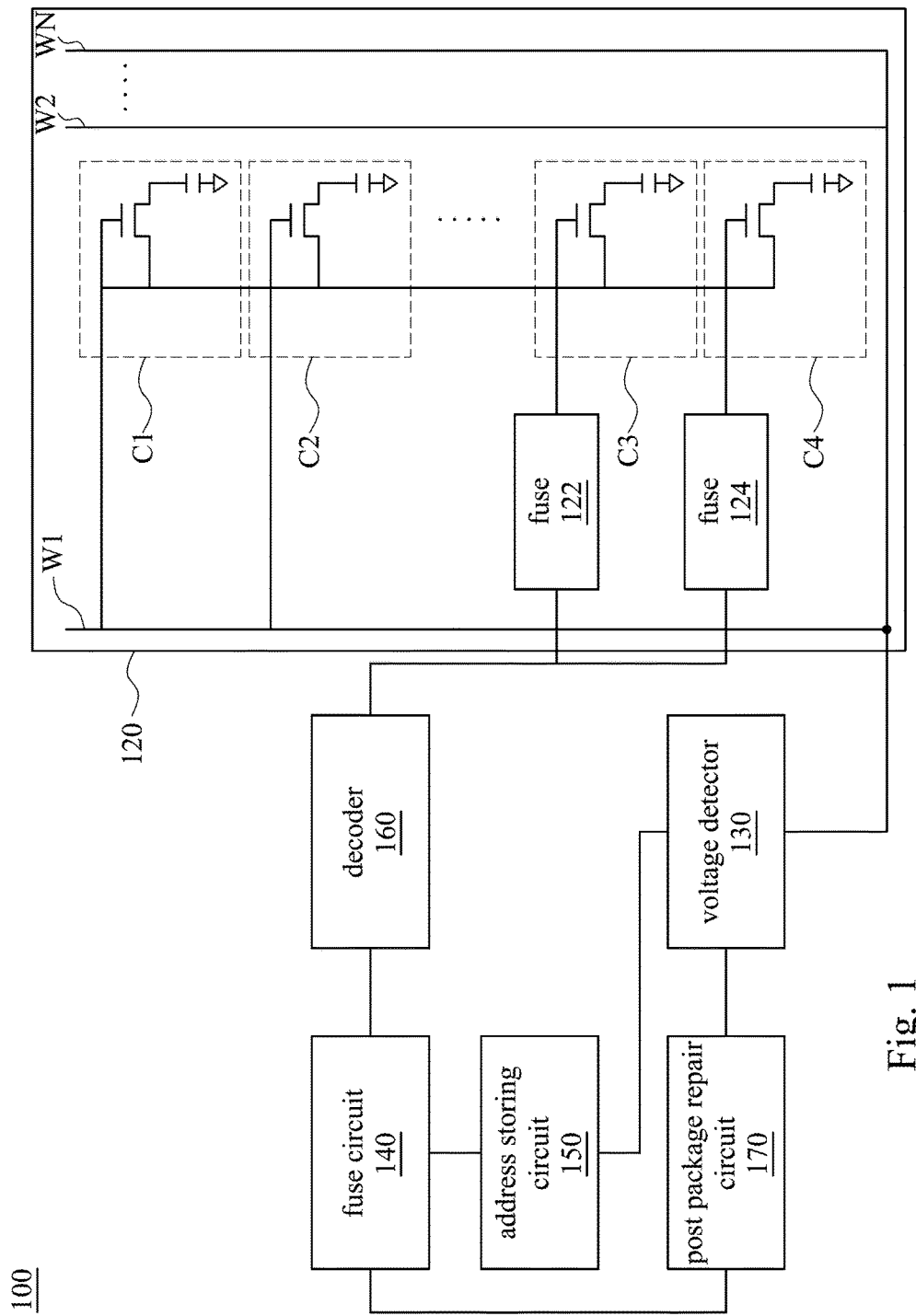
FIG. 1 is a schematic diagram illustrating a fuse blowing system according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

Reference is made to FIG. 1. FIG. 1 is a schematic diagram illustrating a fuse blowing system 100 according to some embodiments of the present disclosure. As illustrated in FIG. 1, the fuse blowing system 100 includes a memory 120, a voltage detector 130, and a fuse circuit 140. The fuse blowing system 100 shown in FIG. 1 is for illustrative purposes only and the present disclosure is not limited thereto.

As illustrated in FIG. 1, the memory 120 includes several word lines W1~WN and several memory cells. Each of the memory cells is electrically connected to one of the word lines. For example, memory cells C1~C4 are electrically connected to word line W1. Among the memory cells, parts of the memory cells are normal cells, and parts of the memory cells are redundant cells. For example, memory cell C1 and memory cell C2 are normal memory cells, and memory cell C3 and memory cell C4 are redundant memory cells. The redundant memory cells C3 and C4 are connected to one of the fuses separately. For example, memory cell C3 is connected to fuse 122, and memory cell C4 is connected to fuse 124. The memory 120 shown in FIG. 1 is for illustrative purposes only and the present disclosure is not limited thereto.

In some embodiments, the voltage detector 130 is configured to detect the voltages of the word lines W1~WN. When it is detected that one of the voltages of the word lines W1~WN is below a voltage threshold, the fuse circuit 160 may blow one of the fuse that is connected to one of the word lines W1~WN, in which the one of the word lines W1~WN is detected with a voltage below a voltage threshold. For example, when the memory cell C1 is damaged, the voltage of word line W1 may drop, and the voltage of word line W1 may be detected to be below the voltage threshold. When it is detected by the voltage detector 130 that the voltage of word line W1 is below the voltage threshold, the fuse circuit 160 may blow the fuse 122. After the fuse 122 is blown, the memory cell C3 may be used for memory storage instead of the damaged memory cell C1, and the voltage of the word line W1 may be raised such that the voltage of the word line W1 is higher than the voltage threshold.

In some embodiments, the voltage detector 130 is configured to determine whether the voltages of world lines W1~WN are below the voltage threshold or not.

In some embodiments, the fuse blowing system 100 includes an address storing circuit 150. The address storing circuit 150 is configured to store several addresses. When one of the voltages of the word lines W1~WN is detected to be below the voltage threshold, the address storing circuit 150 may send address information corresponding to the one of the word lines W1~WN with voltage below the voltage threshold. With the address information, the fuse circuit 140 may know which fuse should be blown.

In some embodiments, when one of the voltages of the word lines W1~WN is detected to be below the voltage threshold, the voltage detector 130 may send an address signal to the address storing circuit 150. In some embodiments, when one of the voltages of the word lines W1~WN is detected to be below the voltage threshold, the voltage detector 130 may send an enabling signal to the fuse circuit 140.

In some embodiments, the address storing circuit 150 may send address information to the fuse circuit 140. In some embodiments, after the fuse circuit 140 receives the address information and the enabling signal, the fuse circuit 140 may generate a fuse signal according to the address information and the enabling signal, and the fuse is blown according to the fuse signal.

In some embodiments, the fuse blowing system 100 includes a decoder 160. The fuse signal generated by the fuse circuit 140 may be sent to the decoder 140. After receiving the fuse signal, the decoder 140 may generate a blowing signal according to the fuse signal, and the blowing signal may be sent to the fuse which is determined to be blown.

In some embodiments, the fuse blowing system 100 includes a post package repair (PPR) circuit 170. The post package repair circuit 170 is configured to receive a triggering signal from the voltage detector when one of the voltages of the word lines W1~WN is detected to be below the voltage threshold. After receiving the triggering signal, the post package repair circuit 170 may send the enabling signal to the fuse circuit 140.

Figure 2:
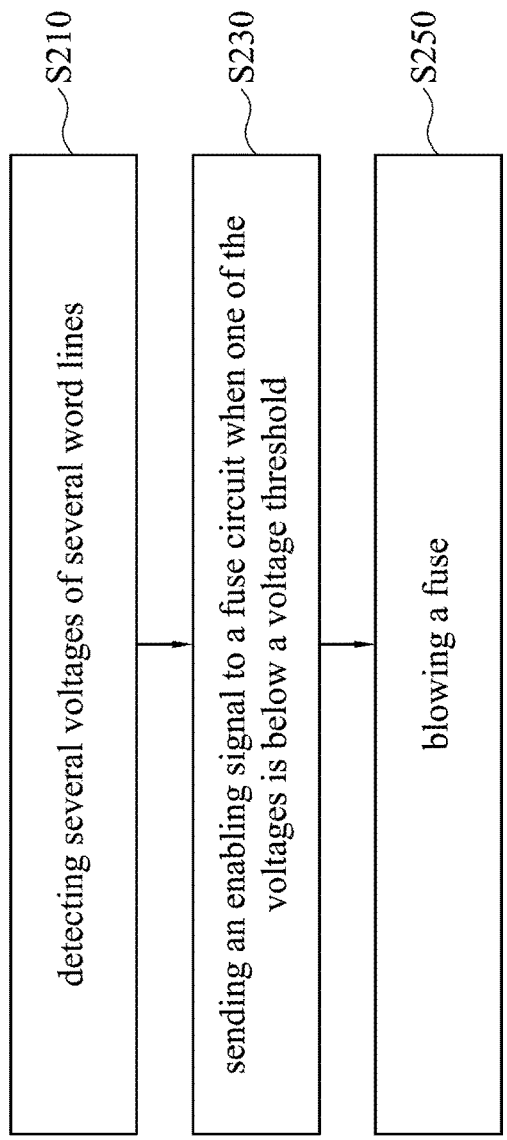
FIG. 2 is a flow chart illustrating a fuse blowing method according to some embodiments of the present disclosure.

Reference is made to FIG. 2. FIG. 2 is a flow chart illustrating a fuse blowing method 200 according to some embodiments of the present disclosure. The fuse blowing method 200 includes the following operations:

S210: detecting several voltages of several word lines;
S230: sending an enabling signal to a fuse circuit when one of the voltages is below a voltage threshold; and
S250: blowing a fuse.

For convenience of explanation and understanding, reference is made to both FIG. 1 and FIG. 2.

In operation S210, detecting several voltages of several word lines. In some embodiments, operation S210 may be performed by the voltage detector 130 in FIG. 1. For example, the voltage detector 130 may detect the voltage of each of the word lines W1~WN. When one of the voltages detected is below the voltage threshold, it may mean that the one of the word lines with the voltage below the voltage threshold has a damaged memory cell.

In operation S230, sending an enabling signal to a fuse circuit when one of the voltages is below a voltage threshold. For example, in some embodiments, when it is determined that one of the voltages of the word lines W1~WN is below the voltage threshold, the voltage detector 130 in FIG. 1 may send a triggering signal to the post package repair circuit 170. After receiving the triggering signal, the post package repair circuit 170 may send an enabling signal to the fuse circuit 140.

In some embodiments, when it is detected that one of the voltages of the word lines W1~WN is below the voltage threshold, an address of the fuse is determined, and the address is sent to the fuse circuit 140. For example, if the memory cell C1 is damaged, the voltage of the word line W1 may drop to be below the voltage threshold. After the voltage of the word line W1 is detected to be below the voltage threshold, the address storing circuit 150 may determine that fuse 122 should be blown, and the address storing circuit 150 may send the address of the fuse 122 to the fuse circuit 140.

In some embodiments, the voltage detector 130 may determine whether one of the voltages of the word lines W1~WN is below the voltage threshold or not. If it is determined that one of the voltages of the word lines W1~WN is below the voltage threshold, the voltage detector 130 may send a triggering signal to the post package repair (PPR) circuit 170. After the post package repair circuit 170 receives the triggering signal, the post package repair circuit 170 may send the enabling signal the fuse circuit 140.

In operation S250, blowing a fuse. For example, when the memory cell C1 is damaged, the voltage of word line W1 may drop, and the voltage of word line W1 may be detected to be below the voltage threshold. When it is detected that the voltage of word line W1 is below the voltage threshold, the fuse circuit 160 may blow the fuse 122, and the voltage of the word line W1 may be raised such that the voltage of the word line W1 is higher than the voltage threshold. In some embodiments, the fuse circuit 250 may send a fuse signal to the decoder 160, and the decoder 160 may decode the fuse signal and blow the fuse according to the fuse signal. For example, the fuse signal may include the information that fuse 122 should be blown, and the decoder 160 may blow fuse 122 after receiving the fuse signal.

In some embodiments, the memory 120 may be a dynamic random access memory (DRAM) or any other circuits with the function of data storing and/or data reading or other similar functions.

According to the embodiment of the present disclosure, it is understood that the embodiment of the present disclosure is to provide a fuse blowing method and a fuse blowing system, in order to auto repair a memory.

In this document, the term "coupled" may also be termed as "electrically coupled", and the term "connected" may be termed as "electrically connected". "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fuse blowing method for a memory, wherein the memory comprises a plurality of word lines and a plurality of memory cells, and the fuse blowing method comprises:
   detecting, by a voltage detector connected to the word lines, a plurality of voltages of the word lines, wherein the memory cells comprise a plurality of normal memory cells and a plurality of redundant memory cells, a gate of a transistor of each of the normal memory cells is electrically connected to one of the word lines, a gate of a transistor of each of the redundant memory cells is electrically connected to one of the word lines via a fuse;
   sending, by a post package repair circuit connected to the voltage detector and a fuse circuit, an enabling signal to the fuse circuit when one of the voltages of the word lines is below a voltage threshold, wherein the one of the voltages corresponds to a first word line of the word lines; and
   blowing, by the fuse circuit connected to the post package repair circuit, one of the fuses, wherein the one of the fuses is connected between the gate of the transistor of one of the redundant memory cells and the first word line, such that the one of the voltages is higher than the voltage threshold.

2. The fuse blowing method of claim 1, comprising:
   determining, by an address storing circuit connected between the fuse circuit and the address storing circuit, an address of the one of the fuses connected between the gate of the transistor of the one of the redundant memory cells and the first word line; and
   sending, by the address storing circuit, the address to the fuse circuit.

3. The fuse blowing method of claim 2, comprising:
   generating a fuse signal according to the address and the enabling signal.

4. The fuse blowing method of claim 3, wherein blowing the fuse comprises:
   decoding the fuse signal sent from the fuse circuit; and
   blowing the fuse according to the fuse signal.

5. The fuse blowing method of claim 1, wherein sending the enabling signal to the fuse circuit comprises:
   determining whether the one of the voltages is below the voltage threshold or not; and
   sending a triggering signal to a post package repair (PPR) circuit when it is determined the one of the voltages is below the voltage threshold.

6. A fuse blowing system, comprising:
   a memory, comprising:
      a plurality of word lines; and
      a plurality of memory cells, wherein the memory cells comprise a plurality of normal memory cells and a plurality of redundant memory cells, a gate of a transistor of each of the normal memory cells is electrically connected to one of the word lines, and a gate of a transistor of each of the redundant memory cells is electrically connected to one of the word lines via a fuse; and
   a voltage detector configured to detect a plurality of voltages of the word lines; and
   a fuse circuit configured to blow one of the fuses when one of the voltages of the word lines detected is below a voltage threshold such that the one of the voltages of the word lines is higher than the voltage threshold, wherein the one of the fuses is connected between the gate of the transistor of one of the redundant memory cells and a first word line of the word lines, wherein the first word line corresponds to the one of the voltages of the word lines.

7. The fuse blowing system of claim 6, comprising:
   an address storing circuit configured to store a plurality of addresses and configured to send address information of the one of the fuse to the fuse circuit when the one of the voltages is below the voltage threshold.

8. The fuse blowing system of claim 7, wherein the fuse circuit is configured to receive an enabling signal when one of the voltages detected is below a voltage threshold.

9. The fuse blowing system of claim 8, wherein the fuse circuit is configured to generate a fuse signal according to the address information and the enabling signal.

10. The fuse blowing system of claim 9, further comprising:
    a decoder configured to generate a blowing signal according to the fuse signal, wherein the blowing signal is sent to the fuse to blow the fuse.

11. The fuse blowing system of claim 7, wherein the address storing circuit is configured to receive an address signal from the voltage detector when the one of the voltages is below the voltage threshold.

12. The fuse blowing system of claim 6, wherein the voltage detector is configured to determine whether the one of the voltages is below the voltage threshold or not.

13. The fuse blowing system of claim 6, comprising:
    a post package repair (PPR) circuit configured to receive a triggering signal from the voltage detector when the one of the voltages is below the voltage threshold and configured to send an enabling signal to the fuse circuit when receiving the triggering signal.

* * * * *